(12) United States Patent
Yukumoto et al.

(10) Patent No.: US 10,747,203 B2
(45) Date of Patent: Aug. 18, 2020

(54) MODELING PROCESS DEVICE, MODELING PROCESS SYSTEM, AND MEDIUM

(71) Applicants: Reiji Yukumoto, Kanagawa (JP); Koji Kobayashi, Kanagawa (JP); Hiroshi Maeda, Kanagawa (JP); Yasuaki Yuji, Kanagawa (JP); Fei Yang, Tokyo (JP)

(72) Inventors: Reiji Yukumoto, Kanagawa (JP); Koji Kobayashi, Kanagawa (JP); Hiroshi Maeda, Kanagawa (JP); Yasuaki Yuji, Kanagawa (JP); Fei Yang, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 31 days.

(21) Appl. No.: 16/010,693

(22) Filed: Jun. 18, 2018

(65) Prior Publication Data

US 2018/0299869 A1 Oct. 18, 2018

Related U.S. Application Data

(63) Continuation of application No. PCT/JP2016/086265, filed on Dec. 6, 2016.

(30) Foreign Application Priority Data

Jan. 14, 2016 (JP) .................................. 2016-005209

(51) Int. Cl.
*G06F 30/00* (2020.01)
*G05B 19/4099* (2006.01)
(Continued)

(52) U.S. Cl.
CPC .......... *G05B 19/4099* (2013.01); *B33Y 50/00* (2014.12); *G06F 30/00* (2020.01);
(Continued)

(58) Field of Classification Search
None
See application file for complete search history.

(56) References Cited

U.S. PATENT DOCUMENTS 8,686,992 B1 * 4/2014 Makadia ............ G06K 9/00214
345/419
9,172,829 B2 * 10/2015 Boyer .................... B33Y 10/00
(Continued)

FOREIGN PATENT DOCUMENTS

GB        2514320       11/2014
JP     2000-020723       1/2000
(Continued)

OTHER PUBLICATIONS

Extended European Search Report for 16885065.9 dated Nov. 23, 2018.

(Continued)

*Primary Examiner* — Said Broome
(74) *Attorney, Agent, or Firm* — IPUSA,PLLC

(57) ABSTRACT

A modeling process device for performing a three-dimensional object modeling process is provided. The modeling process device includes an accumulation unit configured to accumulate a plurality of three-dimensional object information sets each including corresponding surface shape information items for three-dimensional objects; a searching unit configured to, based on surface shape information of a three-dimensional object generated by a scanning unit that scans a surface of the three-dimensional object, search for a three-dimensional object information set used for modeling in the plurality of the three-dimensional object information sets accumulated in the accumulation unit; and an extraction unit configured to extract a modeling condition that has been
(Continued)

used for modeling the three-dimensional object according to the surface shape information that has been generated by the scanning unit.

7 Claims, 17 Drawing Sheets

(51) Int. Cl.
*H04N 1/409* (2006.01)
*B33Y 50/00* (2015.01)
*B33Y 50/02* (2015.01)
*B29C 64/386* (2017.01)

(52) U.S. Cl.
CPC ......... *H04N 1/4092* (2013.01); *B29C 64/386* (2017.08); *B33Y 50/02* (2014.12); *G05B 2219/49023* (2013.01)

(56) References Cited

U.S. PATENT DOCUMENTS

| 2015/0009214 A1* | 1/2015 | Lee .................. G06T 17/10 345/420 |
| 2015/0197064 A1 | 7/2015 | Walker et al. |
| 2017/0124223 A1 | 5/2017 | Maeda et al. |

FOREIGN PATENT DOCUMENTS

| JP | 2004-034298 | 2/2004 |
| JP | 2012-101446 | 5/2012 |
| JP | 2015-231744 | 12/2015 |

OTHER PUBLICATIONS

International Search Report dated Mar. 7, 2017 in PCT/JP2016/086265 filed on Dec. 6, 2016 (With English Translation).

* cited by examiner

FIG.4

```
solid ascii
facet normal 0.000000 0.000000 1.000000
    outer loop
        vertex 0.000000 2.000000 5.000000
        vertex -2.000000 2.000000 5.000000
        vertex 0.000000 0.000000 5.000000
    endloop
endfacet
facet normal 0.000000 0.000000 1.000000
    outer loop
        vertex 0.000000 0.000000 5.000000
        vertex -2.000000 2.000000 5.000000
        vertex -2.000000 0.000000 5.000000
    endloop
endfacet
facet normal 0.000000 0.000000 -1.000000
    outer loop
        vertex 0.000000 0.000000 0.000000
        vertex -2.000000 0.000000 0.000000
        vertex 0.000000 2.000000 0.000000
    endloop
endfacet
...
endsolid
```

| ITEM | CONTENT |
|---|---|
| LAYER PITCH | 0.10 mm |
| MODELING DIRECTION | WITH RESPECT TO X-AXIS: 90 DEGREES ROTATION<br>WITH RESPECT TO Y-AXIS: 100 DEGREES ROTATION<br>WITH RESPECT TO Z-AXIS: 30 DEGREES ROTATION |

MODELING PROCESS DEVICE, MODELING PROCESS SYSTEM, AND MEDIUM

CROSS-REFERENCE TO RELATED APPLICATIONS

The present application is a continuation application of International Application No. PCT/JP2016/086265 filed on Dec. 6, 2016, which claims priority to Japanese Patent Application No. 2016-005209 filed on Jan. 14, 2016. The contents of these applications are incorporated herein by reference in their entirety.

BACKGROUND OF THE INVENTION

1. Field of the Invention

The present invention relates to a modeling process device and a modeling process system for performing a modeling process of a three-dimensional object, and relates to a recording medium storing a program for causing a computer to perform a process to obtain information used for modeling a modeling object that is a copy of the three-dimensional object and to output the modeling object.

2. Description of the Related Art 3D printers have become popular, and it has become possible for anybody to model a three-dimensional object if 3D model data is available. The 3D model data is made by a CAD (Computer Aided Design) system, etc. In recent years, a method has been proposed in which 3D model data is made from surface shape information that is scanned by a 3D scanner (e.g., refer to Patent Document 1).

CITATION LIST

Patent Document
[Patent Document 1] Japanese Unexamined Patent Application Publication No. 2012-101446

SUMMARY OF THE INVENTION

Technical Problem

However, according to the above-described method, in the case where the three-dimensional object as a copy source is a modeling object modeled by a 3D printer, there is a problem in that the similar object cannot be copied even if the modeling is performed based on the 3D model data obtained by three-dimensional measurement. This is because: when modeling with a 3D printer, it is necessary to specify not only the 3D model data but also a modeling condition such as a layer pitch; and the similar object cannot be obtained unless the modeling is performed under the same modeling condition for the copy source three-dimensional object.

The present invention has been made in view of the above problem. An object of the present invention is to provide a device, a system, and a program that are capable of, when performing copying by using a modeling object that has been modeled by a 3D printer as a copy source three-dimensional object, obtaining a modeling object that is the same as the copy source three-dimensional object.

Solution to Problem

According to an embodiment of the present invention, a modeling process device for performing a modeling process of a three-dimensional object is provided. The modeling process device includes an accumulation unit configured to accumulate a plurality of three-dimensional object information sets each including corresponding surface shape information items for three-dimensional objects; a searching unit configured to, based on surface shape information of the three-dimensional object generated by a scanning unit that scans a surface of the three-dimensional object, search for a three-dimensional object information set used for modeling in the three-dimensional object information sets accumulated in the accumulation unit; and an extraction unit configured to extract a modeling condition that has been used for modeling the three-dimensional object based on the surface shape information generated by the scanning unit.

Advantageous Effects of Invention

According to an embodiment of the present invention, it is possible to, when copying a modeled three-dimensional object, obtain a modeling object that is the same as the three-dimensional object.

BRIEF DESCRIPTION OF THE DRAWINGS

FIG. 4 is a drawing illustrating an example of 3D scan data or 3D model data.

DETAILED DESCRIPTION OF THE PREFERRED EMBODIMENTS

Figure 1:
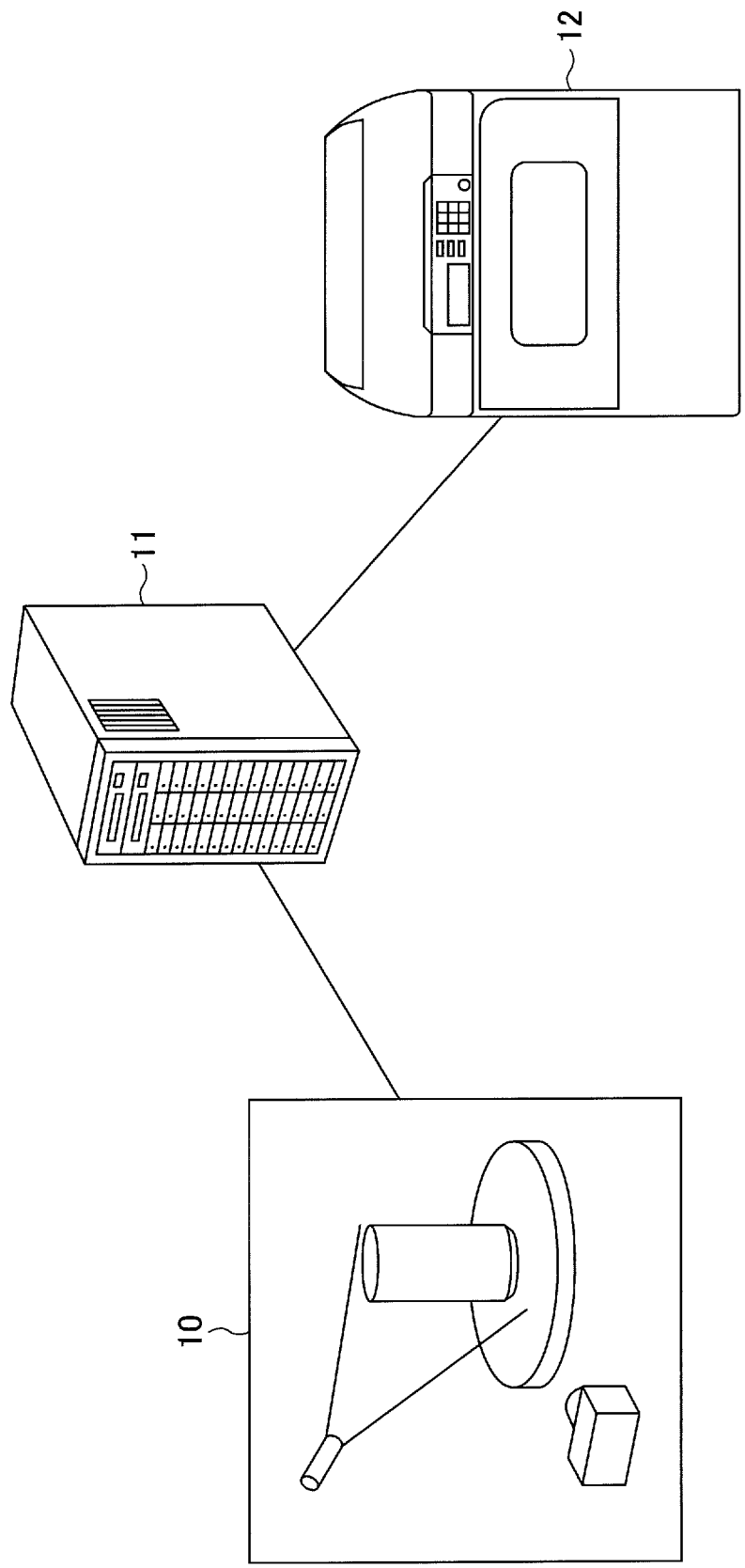
FIG. 1 is a drawing illustrating an example of a configuration of a modeling process system.

FIG. 1 is a drawing illustrating an example of a configuration of a modeling process system for performing a modeling process of a three-dimensional object. The modeling process system illustrated in FIG. 1 includes a scanning device as a scanning unit, an information processing device, and a modeling device as a modeling unit. The scanning device scans a surface of the three-dimensional object as a copy source, and outputs surface shape information of the three-dimensional object. The scanning device is, for example a 3D scanner 10. The surface shape information is 3D scan data that is output from the 3D scanner 10.

The information processing device obtains the 3D scan data from the scanning device, and performs processes such as a process of searching for three-dimensional object information used for modeling. The information processing device is, for example, a 3D model data server 11. The information processing device accumulates a plurality of 3D model data sets, searches for and identifies a 3D model data set used for modeling in the 3D model data sets. Further, the information processing device outputs the identified 3D model data set to the modeling device.

The modeling device receives the 3D model data set from the information processing device, and models a modeling object based on the 3D model data set. The modeling device is, for example, a 3D printer 12, and models a copy of the three-dimensional object that has been scanned by the 3D scanner 10 by modeling a modeling object.

The 3D scanner 10, the 3D model data server 11, and 3D printer 12 may be directly connected to each other via a cable, or may be connected to each other via a network such as a LAN (Local Area Network), the Internet, etc. It should be noted that the network may be a wired network or a wireless network. Further, the modeling system may include other devices such as an access point, a proxy server, a print server, a DNS (Domain Name System) server, etc., as necessary.

The 3D scanner 10 may be a contact type scanner or a non-contact type scanner depending on scanning methods. In an example in FIG. 1, the 3D scanner 10 is illustrated as a non-contact type 3D scanner. The contact type 3D scanner includes, as hardware, a sensor. In the contact type 3D scanner, the sensor is pressed upon a surface of the three-dimensional object as a copy source, and three-dimensional position coordinates on the surface, upon which the sensor has been pressed, are measured for multiple positions.

The non-contact type 3D scanner may be a type that uses laser light or a type that uses pattern light. The 3D scanner of a type that uses laser light includes an emitting device emitting laser light and a sensor. The laser light is emitted by the emitting device onto the three-dimensional object as a copy source, the laser light reflected by the three-dimensional object is sensed by the sensor, and a distance to each of the positions on the surface of the three-dimensional object is measured by using, for example, trigonometry. The 3D scanner of a type that uses pattern light includes an emitting device emitting pattern light and a sensor. Striped pattern light is emitted by the emitting device onto the three-dimensional object as a copy source, lines included in the striped pattern are sensed by the sensor, and a distance to each of the positions on the surface of the three-dimensional object is measured.

The 3D printer 12 may be a 3D printer that uses, as a modeling method, Fused Deposition Modeling (FDM), Stereo lithography (STL), Selective Laser Sintering (SLS), etc. The 3D printer using Fused Deposition Modeling (FDM) performs modeling by successively layering layers of melted-by-heat modeling material, resin, one on top of the other. As the resin, ABS (Acrylonitride Butadiene Styrene) resin, polycarbonate resin, polyphenylsulfone resin, polylactic acid, etc., may be used.

The 3D printer using Stereo lithography (STL) performs modeling by emitting ultraviolet rays onto a liquid resin to solidify little by little the resin as a modeling material. As the resin, a photocurable resin is used. The 3D printer using Selective Laser Sintering (SLS) performs modeling by repeating: spreading a powdered plaster or resin as a layer with a predetermined thickness; spreading an adhesive at predetermined positions on the layer; and spreading a powdered plaster or resin thereon.

In FIG. 1, a modeling process system is illustrated in which separate three devices, the 3D scanner 10, the 3D model data server 11, and the 3D printer 12, are included. The three devices may be included in a single housing as a modeling process device. Further, the modeling process system may be composed of the 3D scanner 10 and the 3D model data server 11. The modeling process device may be the one in which the above-three devices are included in a single housing, may be the one in which the 3D scanner 10 and the 3D model data server 11 are included in a single housing, or may be the one in which only the 3D model data server 11 is included in a housing.

Figure 2:
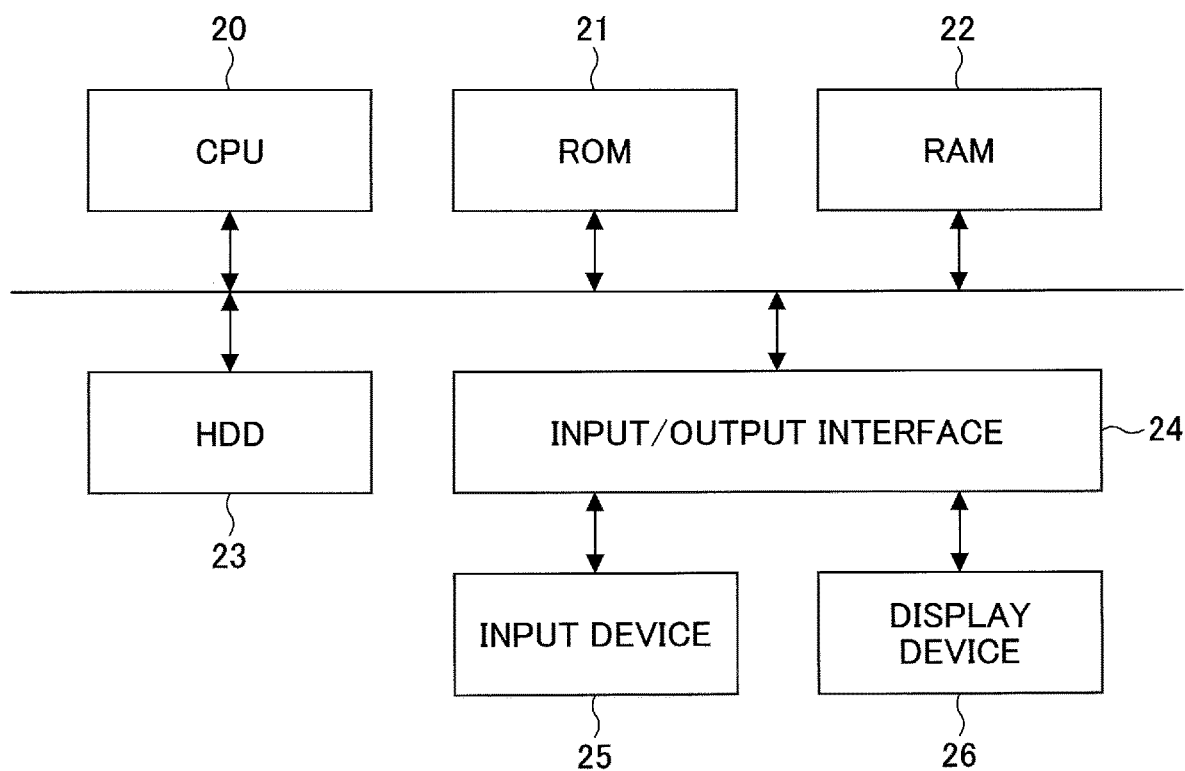
FIG. 2 is a drawing illustrating a hardware structure of an information processing device.

Referring to FIG. 2, a hardware structure of the 3D model data server 11 will be described. Similar to a typical PC, the 3D model data server 11 includes a CPU 20, a ROM 21, a RAM 22, a HDD 23, an input/output interface 24, an input device 25, and a display device 26.

The CPU 20 controls operations of the entire 3D model data server 11. The ROM 21 stores a boot program used for starting the 3D model data server 11, firmware, etc. The RAM 22 provides a work space for the CPU 20. The HDD 23 stores a program for executing processes of obtaining and outputting the above-described 3D model data sets, OS, and a plurality of the 3D model data sets.

The input/output interface 24 is used for connecting to the input device 25, the display device 26, the 3D scanner 10, and the 3D printer 12, and controls inputting and outputting data and information. The input device 25 is a mouse, a keyboard, etc., and receives instructions and input information from a user. The display device 26 displays the 3D scan data, the identified 3D model data, etc.

It should be noted that the hardware of the 3D model data server 11 is not limited to the above. The 3D model data server 11 may further include a communication interface for connecting to a network, an external storage device interface for connecting to an external storage device, etc. Therefore, the 3D model data is not limited to be stored in the HDD 23 included in the 3D model data server 11, and may be stored in an external storage device that is accessible from the 3D model data server 11. Further, the 3D model data may be stored in another device or database with which the 3D model data server 11 is enabled to communicate via a network.

Figure 3:
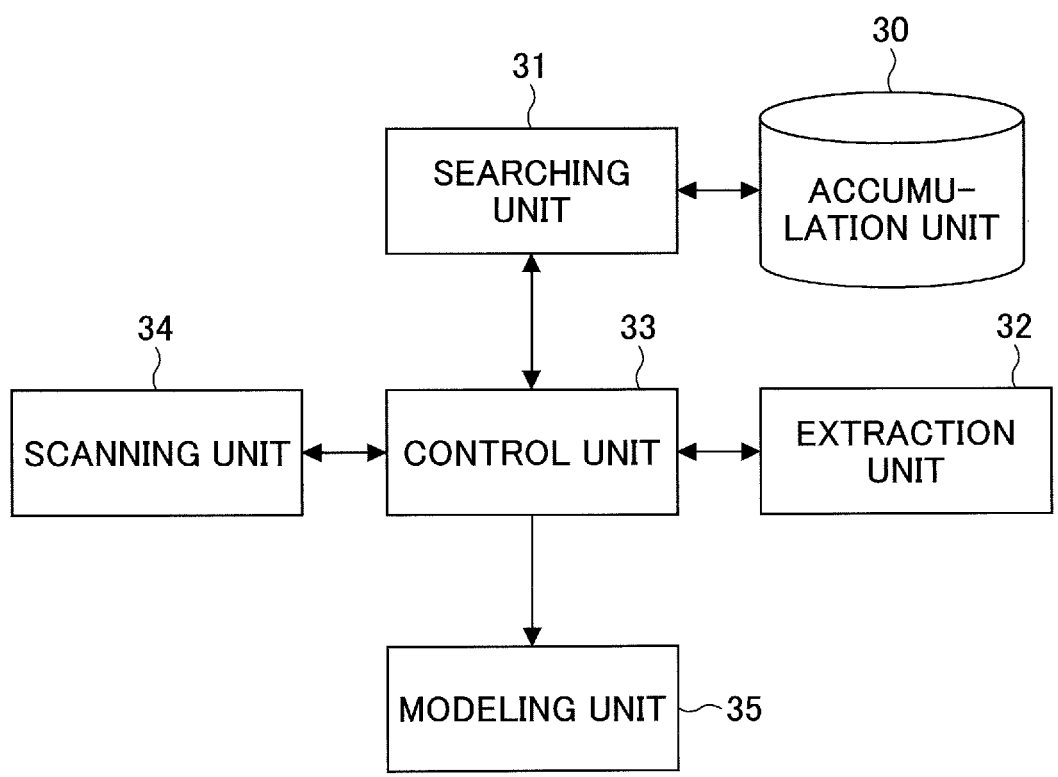
FIG. 3 is a block diagram illustrating a first functional structure of the modeling process system.

FIG. 3 is a block diagram illustrating a first functional structure of the modeling process system. The modeling process system includes an accumulation unit 30, a searching unit 31, an extraction unit 32, a control unit 33 that also functions as an output unit, a scanning unit 34, and a modeling unit 35. The modeling process system includes at least the accumulation unit 30, the searching unit 31, the extraction unit 32, the control unit 33, and the scanning unit 34, and may include the modeling unit 35 as necessary. The searching unit 31, the extraction unit 32, and the control unit 33 are realized by the CPU 20 by executing the above-described program. The accumulation unit 30 is realized by the HDD 23, or the like. Further, the scanning unit 34 is realized by the 3D scanner 10, and the modeling unit 35 is realized by the 3D printer 12.

The scanning unit 34 scans a surface of the three-dimensional object as a copy source, and generates surface shape information as the 3D scan data. Here, the three-dimensional object as a copy source is a three-dimensional modeling object that has been modeled by the modeling unit 35, or the like. The 3D scan data may have a format as illustrated in, for example, FIG. 4. The format may be a set of triangle data in which positions (coordinates) of three-dimensional vertexes are specified, and specifically, the format may be STL (Standard Triangulated Language).

In the 3D scan data expressed by STL as illustrated in FIG. 4, a piece of triangle data is represented by descriptions from "facet" to "endfacet". "normal" represents a normal vector of a triangle, and "vertex" represents each of the three vertex positions of the triangle. A three-dimensional shape is expressed by repeatedly describing the above-described triangle data. Here, the 3D scan data has been described. The 3D model data may be expressed in the similar manner. It should be noted that the format of the 3D scan data or the 3D model data is not limited to STL, and any format may be used as long as it is capable of expressing a three-dimensional shape.

The accumulation unit 30 accumulates, as a plurality of 3D model data sets, a plurality of three-dimensional object information sets each including corresponding surface shape information items for three-dimensional objects. Therefore, a three-dimensional object information set may include internal structure information of the three-dimensional object. The internal structure information includes, for example, information indicating "hollow".

The searching unit 31 searches for a 3D model data set to be used for modeling in the plurality of the 3D model data sets accumulated in the accumulation unit 30 based on the 3D scan data generated by the scanning unit 34. The searching unit 31 searches for a 3D model data set, that has a surface shape information item similar to the surface shape of the three-dimensional object expressed by the 3D scan data set, in the plurality of the 3D model data sets. Further, the searching unit 31 identifies the searched 3D model data set as the 3D model data set to be used for modeling.

The extraction unit 32 extracts a modeling condition that has been used for modeling the three-dimensional object according to the 3D scan data generated by scanning unit 34. The modeling condition includes a layer pitch, a modeling direction, etc., that have been specified when modeling the three-dimensional object. The layer pitch is a thickness of each layer when successively layering the layers of powdered resin or plaster. The modeling direction is a direction in which the three-dimensional object has been modeled by successively layering the layers (layering direction). In the following descriptions, these conditions (layer pitch and modeling direction) will be used as the modeling condition. However, the modeling condition is not limited to these conditions.

Figures 5, 6:
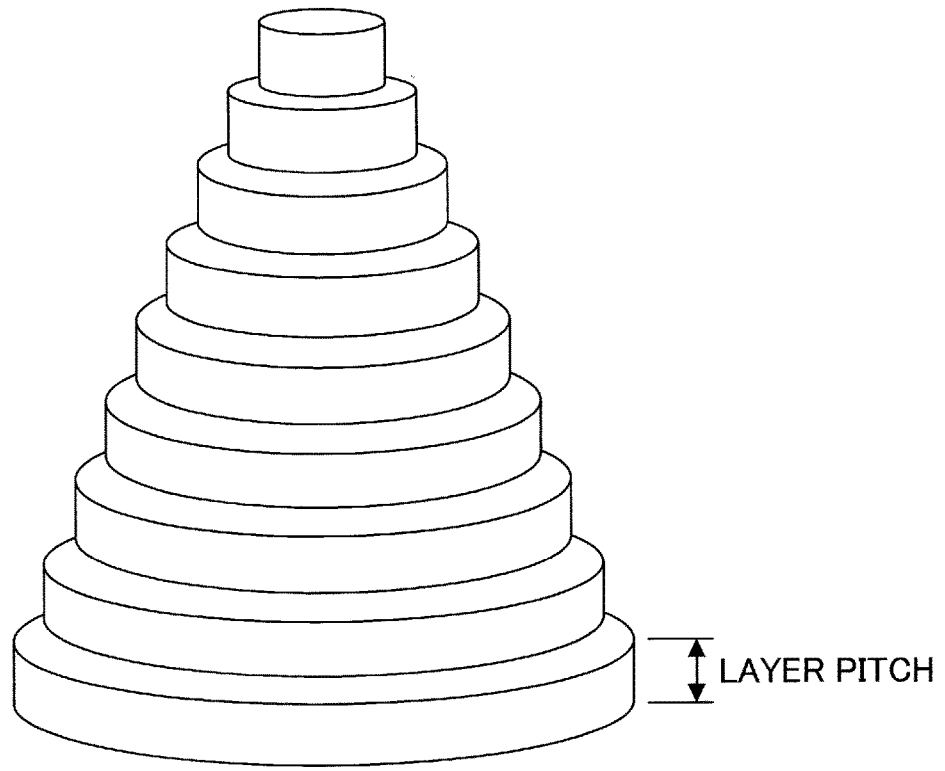
FIG. 5 is a drawing illustrating an example of a modeling condition.
FIG. 6 is a drawing illustrating a layer pitch.

The modeling condition may be, for example, what is illustrated in FIG. 5. The modeling condition includes items and corresponding contents. The items include the above-described layer pitch or modeling direction, and the contents are a height of each layer (mm) and a layering direction. The layering direction includes angles with respect to X-axis, Y-axis, and Z-axis. The X-axis is a direction parallel to one of two sides of a rectangle-shaped modeling tank included in the 3D printer viewed in a top view, the Y-axis is a direction parallel to the other one of the two sides, and the Z-axis is a direction orthogonal to the X-axis and the Y-axis, and is a height direction of the modeling tank.

Referring to a three-dimensional object illustrated in FIG. 6, the layer pitch will be described. The three-dimensional object illustrated in FIG. 6 is a modeled conical three-dimensional object. In order to make it conical, the conical three-dimensional object has been modeled by successively layering the layers of disks whose diameter decreases layer by layer. The thickness or the height of each of the disks is the thickness of each layer, and is the layer pitch.

Figure 7A:
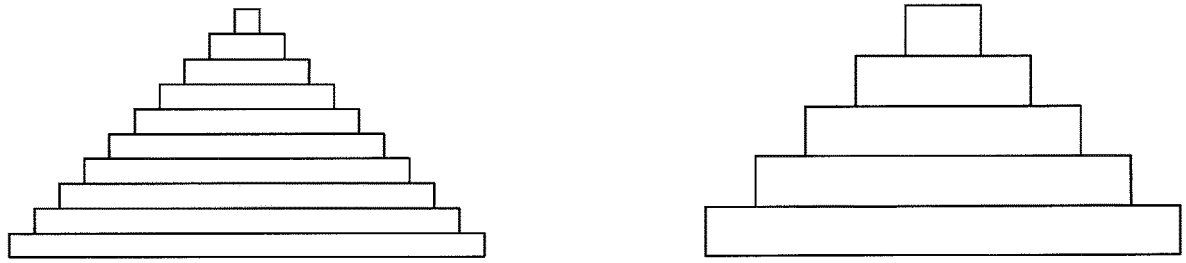
FIG. 7A is a drawing illustrating a difference of the layer pitch.

The degree (size) of the layer pitch can be determined by measuring the surface of the three-dimensional object as a copy source. This is because, as illustrated in FIG. 7A, the difference of the layer thicknesses appears on the surfaces of the three-dimensional objects due to the fact that the three-dimensional objects have been modeled by the 3D printer by successively layering the layers. The measurement of the surface may be performed by an image analysis.

Figure 7B:
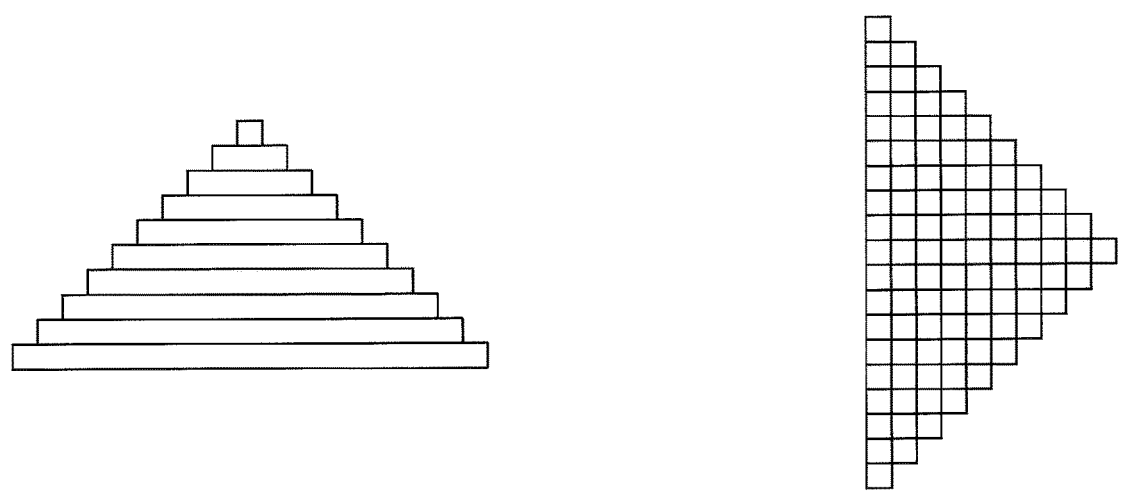
FIG. 7B is a drawing illustrating a difference of a modeling direction.

Similar to the layer pitch, the modeling direction can be determined also by measuring the surface of the three-dimensional object as a copy source. This is because, as illustrated in FIG. 7B, the difference of the modeling directions appears on the surfaces of the three-dimensional objects due to the fact that the three-dimensional objects have been modeled by the 3D printer by successively layering the layers. It should be noted that FIG. 7B illustrates a conical three-dimensional object that has been modeled by layering disks, and illustrates a three-dimensional object that is obtained by rotating the conical three-dimensional object in 90 degrees, which has been modeled by layering rectangular solids, or the like.

The control unit 33 controls the entire modeling process system. The control unit 33 receives a request for copying the three-dimensional object from a user, requests that the scanning unit 34 obtain 3D scan data, and obtains the 3D scan data. The control unit 33 requests that the searching unit 31 search for the 3D model data, and obtains the 3D model data. Further, the control unit 33 requests that the extraction unit 32 extract a modeling condition, and obtains the modeling condition. Further, the control unit 33 transmits the 3D model data, that has been searched for by the searching unit 31, and the modeling condition, that has been extracted by the extraction unit 32, to the modeling unit 35.

The modeling unit 35 models a modeling object based on the 3D model data and the modeling condition received from the control unit 33. The 3D model data may include, other than the surface shape information, internal structure information. Therefore, it is possible for the modeling unit 35 to model the modeling object by reflecting the feature of the internal structure. Further, the modeling unit 35 performs the modeling under the same modeling condition that is used for the three-dimensional object as a copy source, and thus, the modeling is performed by applying the same layer pitch and the same modeling direction. According to the above, it is possible to obtain the same modeling object as the three-dimensional object as a copy source.

Figure 8:
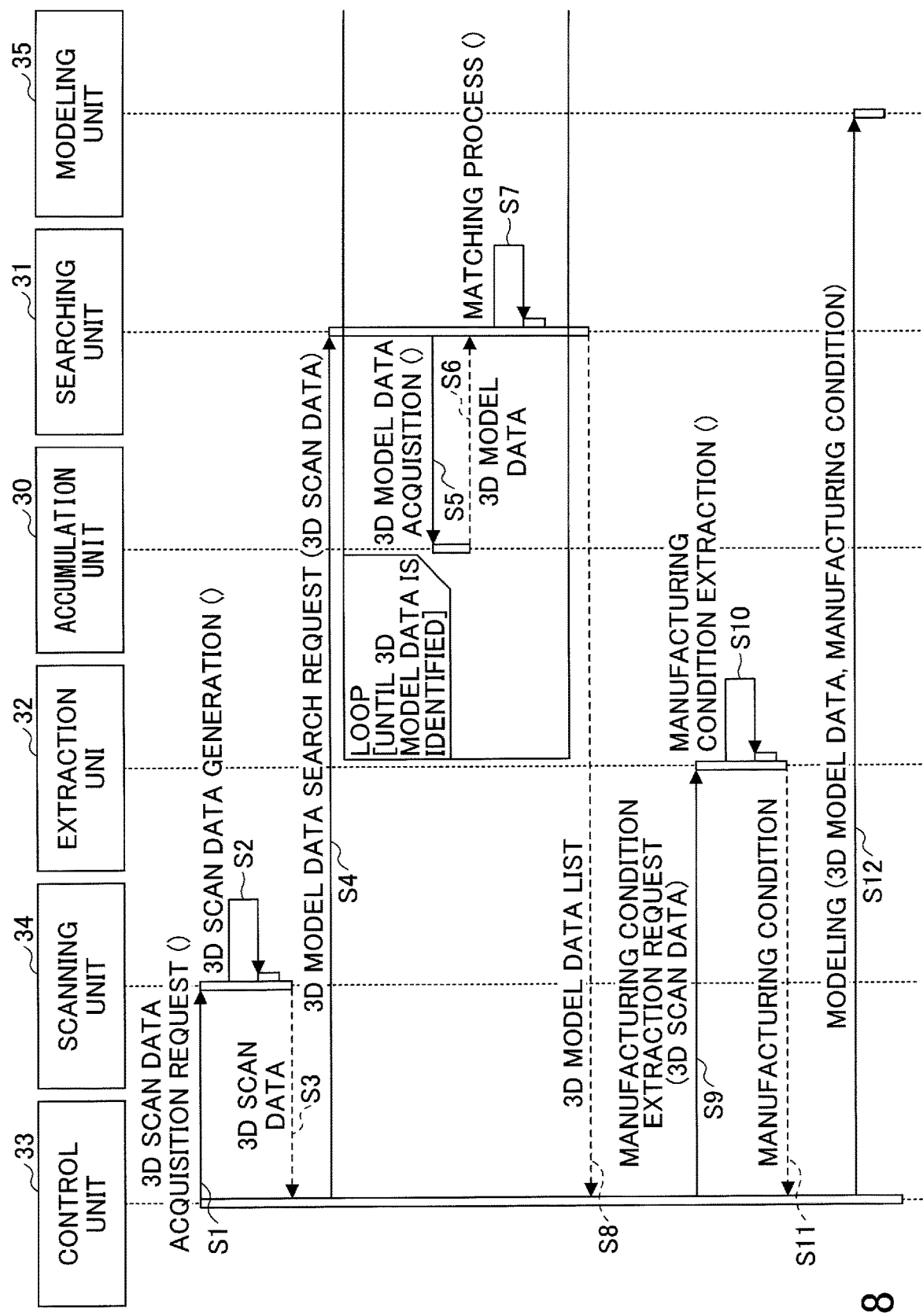
FIG. 8 is a sequence diagram illustrating a first processing flow executed by the modeling process system.

Referring to FIG. 8, processes performed by the modeling process system illustrated in FIG. 3 will be described in detail. In response to receiving a request for copying a three-dimensional object from a user, the control unit 33 requests that the scanning unit 34 obtain 3D scan data (S1). The 3D scan data is surface shape data of the three-dimensional object for which the copy has been requested. The three-dimensional object is a modeling object that has been modeled by the 3D printer. The 3D printer, that has modeled the three-dimensional object as a copy source, may be the 3D printer 12 included in the modeling process system, or may be a different 3D printer.

In response to receiving the request from the control unit 33, the scanning unit 34 scans the surface of the three-dimensional object, and generates 3D scan data (S2). The 3D scan data may be expressed by, for example, STL illustrated in FIG. 4. The scanning unit 34 transmits the generated 3D scan data to the control unit 33 (S3).

After receiving the 3D scan data from the scanning unit 34, the control unit 33 transmits the 3D scan data to the searching unit 31, and requests that the searching unit 31 search for the 3D model data (S4). In response to receiving the request from the control unit 33, the searching unit 31 requests that the accumulation unit 30 obtain a 3D model data set, and obtains the 3D model data set from the accumulation unit 30 (S6).

The searching unit 31 performs a process (matching process) of determining similarity between the 3D scan data and the 3D model data set, and searches for the 3D model data set whose surface shape is similar to the 3D scan data (S7). Processes from S5 to S7 are repeated until the searching for the 3D model data set is completed. The searching unit 31 creates a list of the 3D model data sets as similar shape candidates that have been identified according to the matching process, and transmits the created list to the control unit 33 (S8).

Whether the data is a similar shape candidate can be determined by calculating a parameter (similarity degree) in which the degree of similarity of the surface shape of the three-dimensional object expressed by the data is digitized, and by determining whether the degree of similarity is equal to or greater than a threshold value. The threshold value may be a fixed value and may be stored in the modeling process system. The threshold value may be determined by the modeling process system according to the number of the similar shape candidates.

The degree of similarity of the surface shape between the three-dimensional object expressed by the 3D scan data and the three-dimensional object expressed by the 3D model data may be calculated by using any known method. For example, the degree of similarity may be calculated as a numerical value by using cluster analysis, k-nearest neighbor algorithm, multi-dimensional scaling (MDS), etc. These methods are well known methods, and detailed descriptions will be omitted.

In the case where only one 3D model data set is included in the obtained list, the control unit 33 identifies the 3D model data set as the 3D model data to be used for modeling. In the case where multiple 3D model data sets are included in the obtained list, the control unit 33 identifies a 3D model data set, whose degree of similarity is the highest, as the 3D model data to be used for modeling. It should be noted that the identifying method of the 3D model data to be used for modeling is not limited to the above. The obtained list may be presented to the user, and the 3D model data set selected by the user may be identified as the 3D model data to be user for modeling.

The control unit 33 transmits the 3D scan data to the extraction unit 32, and requests for extraction of a modeling condition (S9). The extraction unit 32 extracts a modeling condition that has been used for modeling the three-dimensional object according to the received 3D scan data (S10). The extraction unit 32 extracts a layer pitch and a modeling direction for the three-dimensional object by analyzing an image of the surface of the three-dimensional object expressed by the 3D scan data.

The extraction unit 32 transmits the extracted modeling condition to the control unit 33 (S11). The modeling unit 33 transmits the 3D model data and the modeling condition received from the extraction unit 32 to the modeling unit 35, and requests that the modeling unit 35 perform modeling (S12). In response to receiving the request, the modeling unit 35 models a modeling object based on the 3D model data and the modeling condition.

Figure 9:
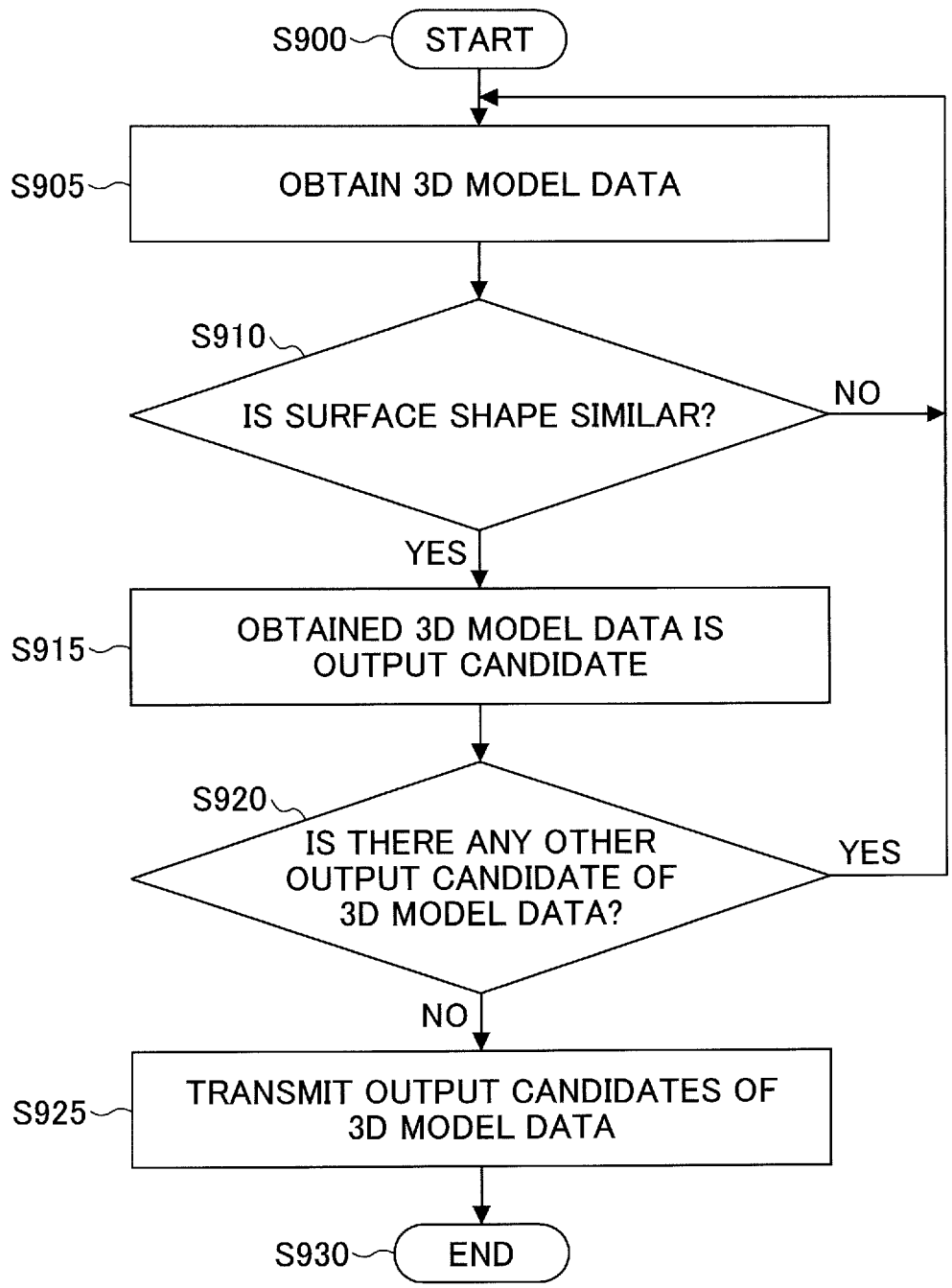
FIG. 9 is a flowchart illustrating a process flow for searching for 3D model data.

Referring to FIG. 9, a process for searching for the 3D model data illustrated in FIG. 8, from S6 to S8 will be described in detail. When the searching unit 31 receives the request from the control unit 33, the process starts from S900. In S905, one of the 3D model data sets accumulated in the accumulation unit 30 is obtained. In S910, it is determined whether the surface shape of the three-dimensional object expressed by the obtained 3D model data is similar to the surface shape of the three-dimensional object expressed by the 3D scan data.

Whether the two surface shapes are similar or not can be determined by determining whether the degree of similarity is equal to or greater than a threshold value. In the case where the surface shapes are similar, the process proceeds to S915. In the case where the surfaces are not similar, the process returns to S905, and another 3D model data is obtained.

In S915, the 3D model data, whose representing surface shape has been determined to be similar to the surface shape expressed by the 3D scan data, is set as an output candidate. In S920, it is determined whether there are other output candidate 3D model data sets. Whether there are other output candidate 3D model data sets or not can be by determined by determining whether the similarity determination has been performed with respect to all of the searching target 3D model data sets that are accumulated in the accumulation unit 30. In the case where there are other output candidate 3D model data sets (undetermined 3D model data sets), the process returns to S905, and, in the case where there is no output candidate 3D model data set, the process proceeds to S 925.

In S925, a list of 3D model data output candidates is transmitted to the control unit 33, and the process ends in S930. The 3D model data output candidates may be all of the 3D model data sets that have been determined to be output candidates in S915, may be a specified number of the 3D model data sets selected from the highest similarity, or may be only the 3D model data with the highest similarity.

In the case where two or more 3D model data sets are transmitted, one of the 3D model data sets may be selected by a user, or, the 3D model data set with the highest similarity may be selected by the control unit 33, and the selected 3D model data set is identified as the 3D model data to be output.

Figure 10:
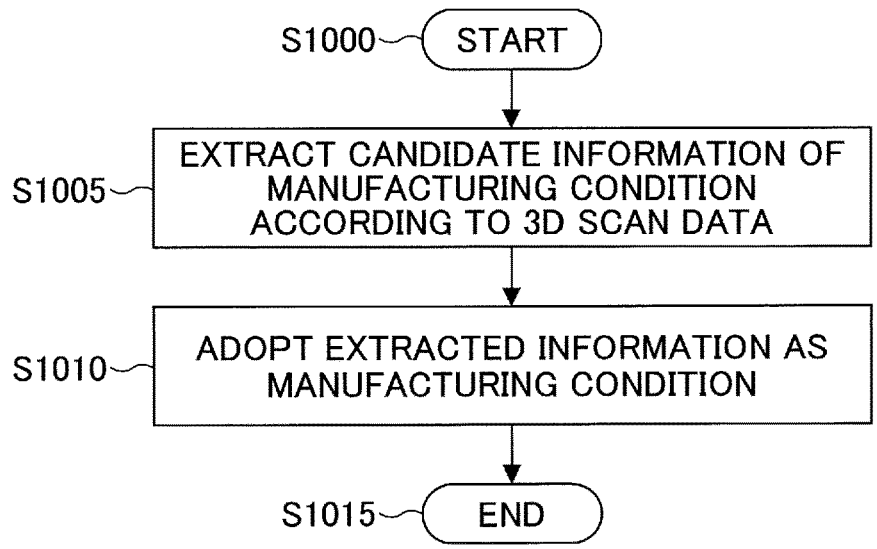
FIG. 10 is a flowchart illustrating a process flow for extracting a modeling condition.

Next, referring to FIG. 10, a process for extracting a modeling condition illustrated in FIG. 8, S10 will be described in detail. When the extraction unit 32 receives the request from the control unit 33, the process starts from S1000. In S1005, candidate information for the modeling condition is extracted according to the 3D scan data. The extraction unit 32 analyses an image of a part of the three-dimensional object expressed by the 3D scan data, and extracts the candidate information for the modeling condition.

The part of the three-dimensional object, whose image is analyzed, may be any portion of the three-dimensional object. The candidate information for the modeling condition is information of the layer pitch and the modeling direction. In order to avoid confusing a step that is created due to the modeling with a step that is created intentionally, it is preferable that the portion do not have a stepped shape.

It should be noted that the 3D scan data includes an error to some extent. In order to reduce the effects of the error, it is desirable that the modeling condition be also extracted according to other portions of the three-dimensional object, and that smoothing be performed by, for example, calculating an average of the extracted modeling condition.

In S1010, the extracted information is adopted as the modeling condition, and the process ends in S1015.

Figure 11:
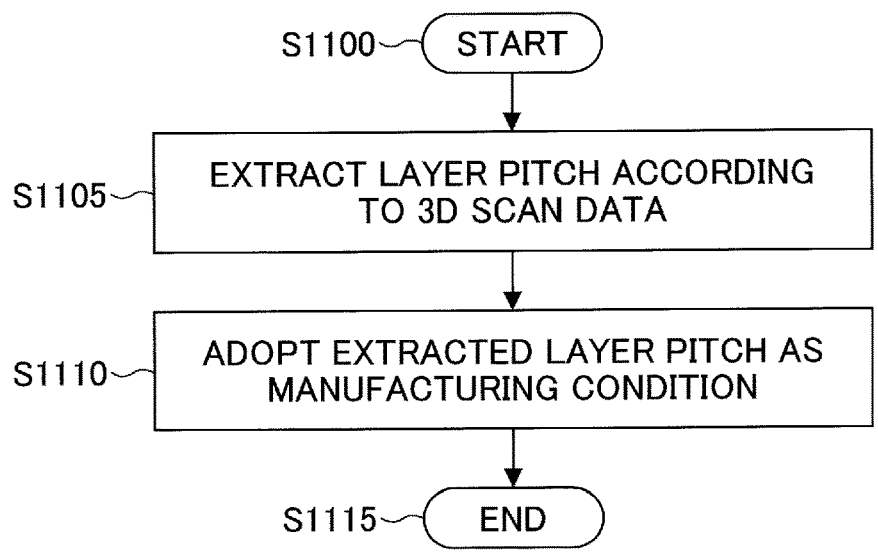
FIG. 11 is a flowchart illustrating a first processing flow for identifying a layer pitch.
Figure 12:
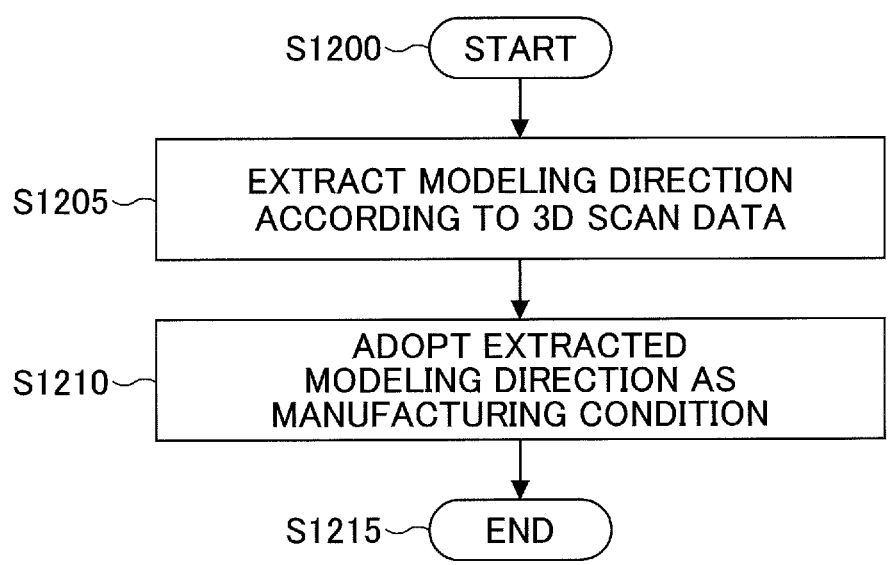
FIG. 12 is a flowchart illustrating a first processing flow for identifying a modeling direction.

Referring to FIG. 11 and FIG. 12, the specific extraction of the modeling condition will be described. FIG. 11 is a flowchart illustrating a first processing flow for identifying a layer pitch as a modeling condition. The process starts from S1100. In S1105, a layer pitch is extracted by analyzing an image of a part of the three-dimensional object expressed by the 3D scan data. In the image analysis, the surface is measured, patterns corresponding to the layer pitch are detected, and the layer pitch is extracted by calculating a distance between the patterns.

It should be noted that the 3D scan data includes an error to some extent. In order to reduce the effects of the error, it is desirable that candidate information items for the layer pitch are also extracted according to other portions of the three-dimensional object, and that smoothing is performed by, for example, calculating an average of the extracted layer pitches.

In S1110, the extracted information is adopted as the layer pitch, and the process ends in S1115.

FIG. 12 is a flowchart illustrating a first processing flow for identifying a modeling direction as a modeling condition. The process starts from S1200. In S1205, candidate information for the modeling direction is extracted by analyzing an image of a part of the three-dimensional object expressed by the 3D scan data. In the image analysis, similar to the above, the surface is measured, patterns corresponding to the layer pitch are detected, and the candidate information for the modeling direction is extracted from the layering direction.

It should be noted that the 3D scan data includes an error to some extent. In order to reduce the effects of the error, it is desirable that the candidate information items for the modeling direction be also extracted according to other portions of the three-dimensional object, and that smoothing be performed by, for example, calculating an average of the extracted modeling directions.

In S1210, the extracted information is adopted as the modeling direction, and the process ends in S1215.

Figure 13:
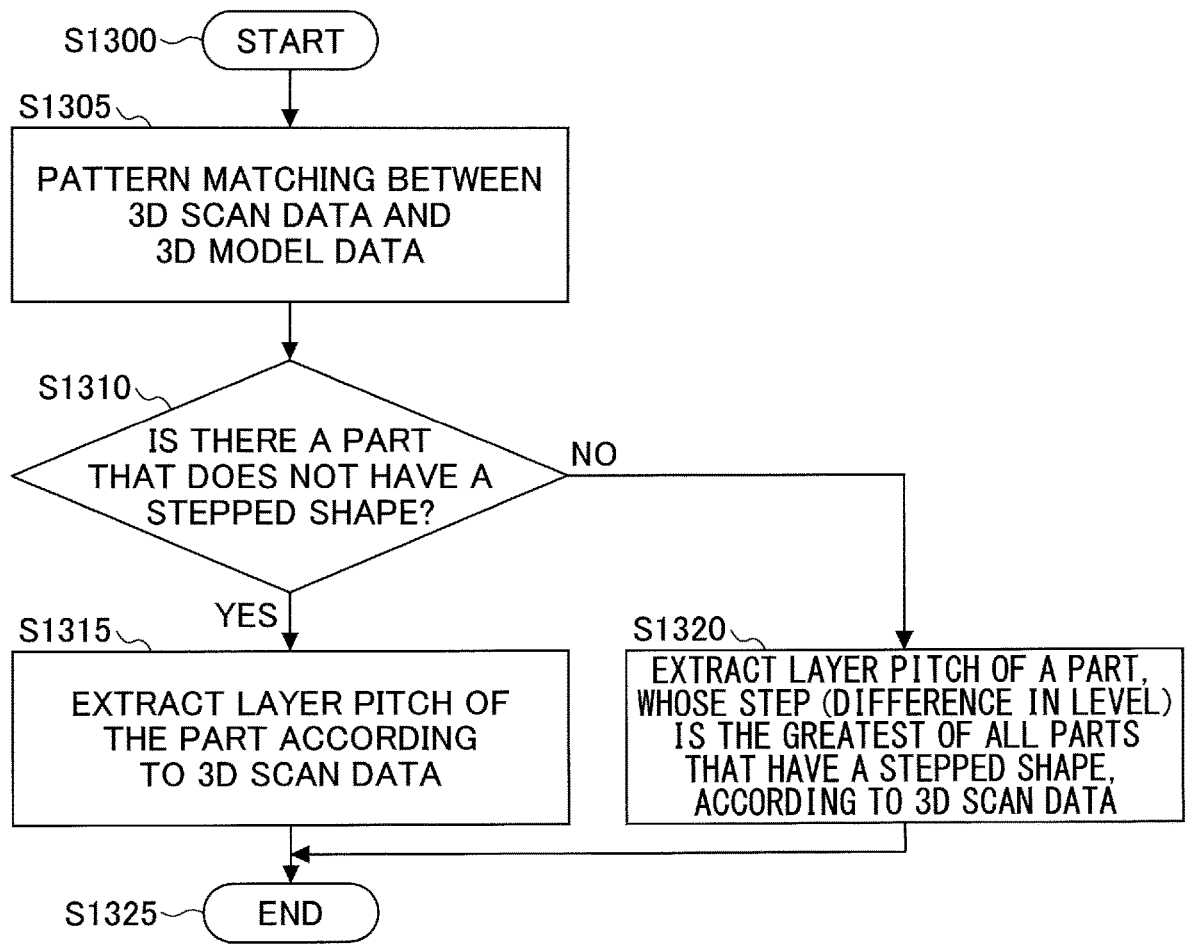
FIG. 13 is a flowchart illustrating a second processing flow for identifying a layer pitch.

FIG. 13 is a flowchart illustrating a second processing flow for identifying a layer pitch as a modeling condition. In this process, not only the 3D scan data, but also the 3D model data is used for identifying the layer pitch. The process starts from S1300. In S13005, the pattern matching is performed between the surface shape of the three-dimensional object expressed by the 3D scan data and the surface shape of the three-dimensional object expressed by the 3D model data. In the pattern matching, the degree of similarity is used as an evaluation value, and whether the two objects are similar or not is determined by determining whether the degree of similarity is equal to or greater than a threshold value. It should be noted that the pattern matching is performed by aligning directions of the two objects.

In S1310, a search is performed for a portion with a non-stepped shape (a portion that does not have a stepped shape) on the surface of the three-dimensional object expressed by the 3D model data. This is because, in the case where a layer pitch of a portion is extracted according to the 3D scan data, and where the portion corresponds to a portion with a stepped shape in the 3D model data, there is a possibility of the portion with a stepped shape intentionally included in the 3D model data being incorrectly detected as a portion with a stepped shape unintentionally created by modeling of the 3D printer. In S1310, in the case where there is a portion with a non-stepped shape (a portion that does not have a stepped shape), the process proceeds to S1315, and in the case where there is no portion with a non-stepped shape, the process proceeds to S1320.

In S1315, a layer pitch of the portion with a non-stepped shape is extracted according to the 3D scan data. In S1320, as there is no portion with a non-stepped shape, from all the portions with a stepped shape, a portion with the greatest level of step is selected, and the layer pitch of the portion is extracted. Further, the process ends in S1325.

As it is likely that a portion with a great level of step is a surface whose stepped shape is included originally in the three-dimensional object, it is possible to exclude the possibility of incorrect detection as much as possible, and to extract the layer pitch appropriately by selecting this portion.

Figure 14:
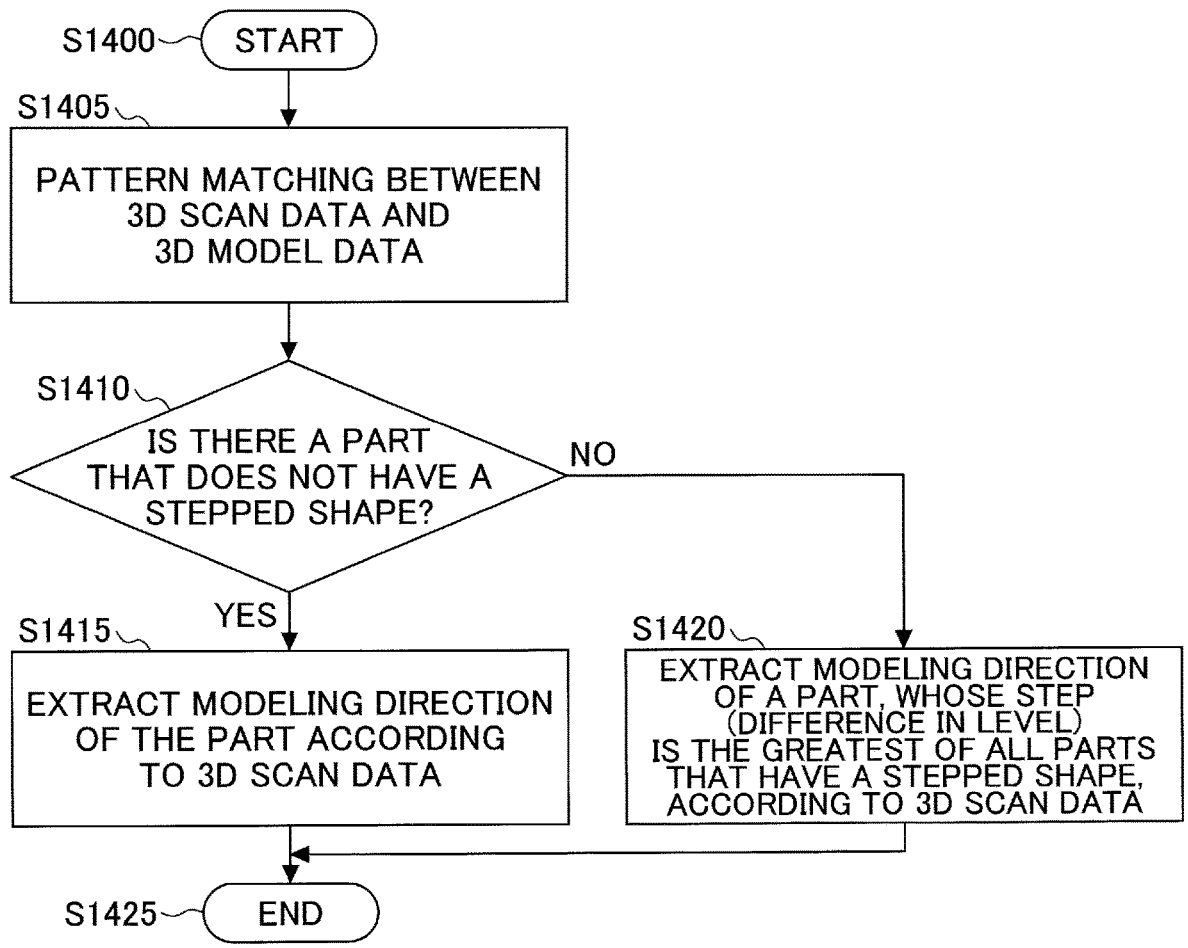
FIG. 14 is a flowchart illustrating a second processing flow for identifying a modeling direction.

FIG. 14 is a flowchart illustrating a second processing flow for identifying a modeling direction as a modeling condition. In this process, not only the 3D scan data, but also the 3D model data is used for identifying the modeling direction. The process starts from S1400. In S1405, pattern matching is performed between the surface shape of the three-dimensional object expressed by the 3D scan data and the surface shape of the three-dimensional object expressed by the 3D model data. In the pattern matching, the degree of similarity is used as an evaluation value, and whether the two objects are similar or not is determined by determining whether the degree of similarity is equal to or greater than a threshold value. It should be noted that the pattern matching is performed by aligning directions of the two objects.

In S1410, a search is performed for a portion with a non-stepped shape on the surface of the three-dimensional object expressed by the 3D model data. This is because, in the case where a modeling direction of a portion is extracted according to the 3D scan data, and where the portion corresponds to a portion with a stepped shape in the 3D model data, there is a possibility of the portion with a stepped shape intentionally included in the 3D model data being incorrectly detected as a portion with a stepped shape unintentionally created by modeling of the 3D printer. In S1410, in the case where there is a portion with a non-stepped shape, the process proceeds to S1415, and in the case where there is no portion with a non-stepped shape, the process proceeds to S1420.

In S1415, a modeling direction of the portion with a non-stepped shape is extracted according to the 3D scan data. In S1420, as there is no portion with a non-stepped shape, from all the portions with a stepped shape, a portion with the greatest level of step is selected, and the modeling direction of the portion is extracted. The extracted modeling direction is candidate information, and the process ends in S1425.

As it is likely that a portion with a great level of step is a surface whose stepped shape is included originally in the three-dimensional object, it is possible to exclude the possibility of incorrect detection as much as possible, and to extract the modeling direction appropriately by selecting this portion.

In the above descriptions, the modeling condition extracted by the extraction unit 32 is transmitted to the modeling unit 35 by the control unit 33, and the modeling object is modeled by the modeling unit 35 based on the modeling condition. Depending on the specifications of the modeling unit 35 (information on supported modeling conditions), there may be a case in which the modeling cannot be performed according to the extracted modeling condition. For example, the same layer pitch cannot be set according to the specifications of the modeling unit 35, and thus, the same layer pitch cannot be used. Therefore, in order to extract modeling condition by taking into account the specifications of the modeling unit 35, and to perform modeling of the modeling object base on the modeling condition, it is possible for the modeling process system to have a functional structure as illustrated in FIG. 15.

Figure 15:
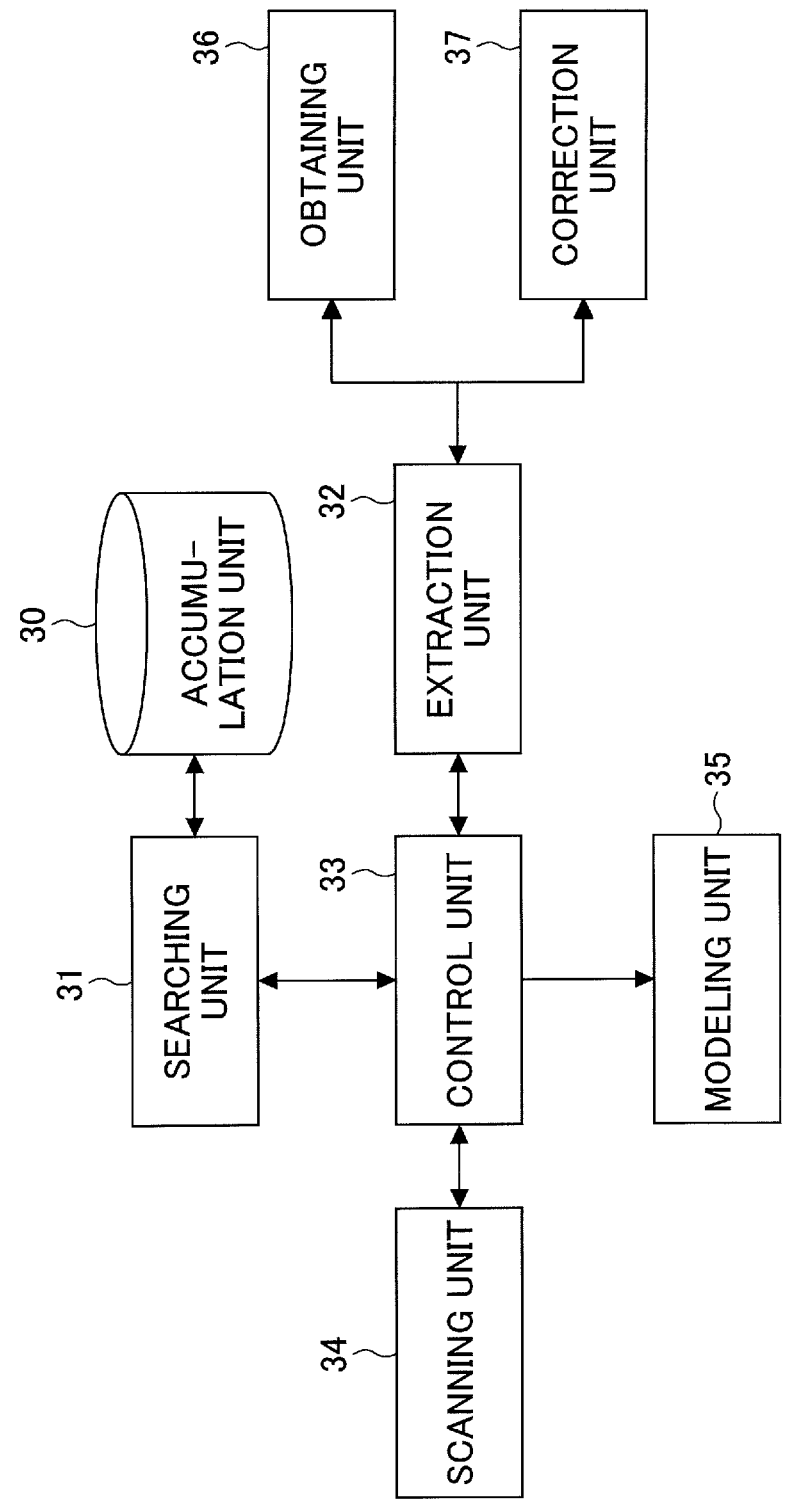
FIG. 15 is a block diagram illustrating a second functional structure of the modeling process system.

FIG. 15 is a block diagram illustrating a second functional structure of the modeling process system. The modeling process system includes, similar to the functional structure illustrated in FIG. 3, an accumulation unit 30, a searching unit 31, an extraction unit 32, a control unit 33, a scanning unit 34, and a modeling unit 35, and in addition, includes an obtaining unit 36 and a correction unit 37. As the accumulation unit 30, the searching unit 31, the extraction unit 32, the control unit 33, the scanning unit 34, and the modeling unit 35 have already been described above, here, only the obtaining unit 36 and the correction unit 37 will be described.

The specifications of the modeling unit 35 include information related to the modeling condition supported by the modeling unit 35, such as layer pitches, modeling directions, etc., that are available to be set. The specifications of the modeling unit 35 may be stored by the modeling unit 35 itself, or may be accumulated together with the 3D model data sets in the accumulation unit 30. Further, the specifications may be stored in other storage units.

After extracting the modeling condition, the extraction unit 32 requests that the obtaining unit 36 obtain the specifications of the modeling unit 35. Here, the requesting is performed after the extraction of the modeling condition. The requesting may be performed before the extraction. The obtaining unit 36 obtains the specifications: by requesting that the modeling unit 35 obtain the modeling conditions in the case where the modeling conditions are stored in the modeling unit 35; by requesting that the accumulation unit 30 obtain the modeling conditions in the case where the modeling conditions are stored in the accumulation unit 30; and by requesting that another storage unit obtain the modeling conditions in the case where the modeling conditions are stored in the other storage unit.

The specifications of the modeling unit 35 are associated with identification information used for identifying the modeling unit 35, and, by transmitting a request in which the identification information is included, it is possible for the obtaining unit 36 to obtain the corresponding specifications.

The correction unit 37 corrects the modeling condition extracted by the extraction unit 32 based on the specifications obtained by the obtaining unit 36. The correction unit 37 checks the extracted modeling condition with the specifications of the modeling unit 35, and performs a process in which the extracted modeling condition is corrected to an appropriate modeling condition. Specifically, in the case where a layer pitch 0.18 mm is extracted by the extraction unit 32 and where the specifications of the modeling unit 35 only correspond to the layer pitches 0.1 mm, 0.2 mm, and 0.3 mm, the correction unit 37 corrects the modeling condition from 0.18 mm to 0.2 mm, which is closest to 0.18 mm.

According to the above, even if the modeling condition extracted by the extraction unit 32 is not included in the specifications of the modeling unit 35, it is still possible to correct the modeling condition appropriately, and to model the modeling object under the appropriate modeling condition.

Figure 16:
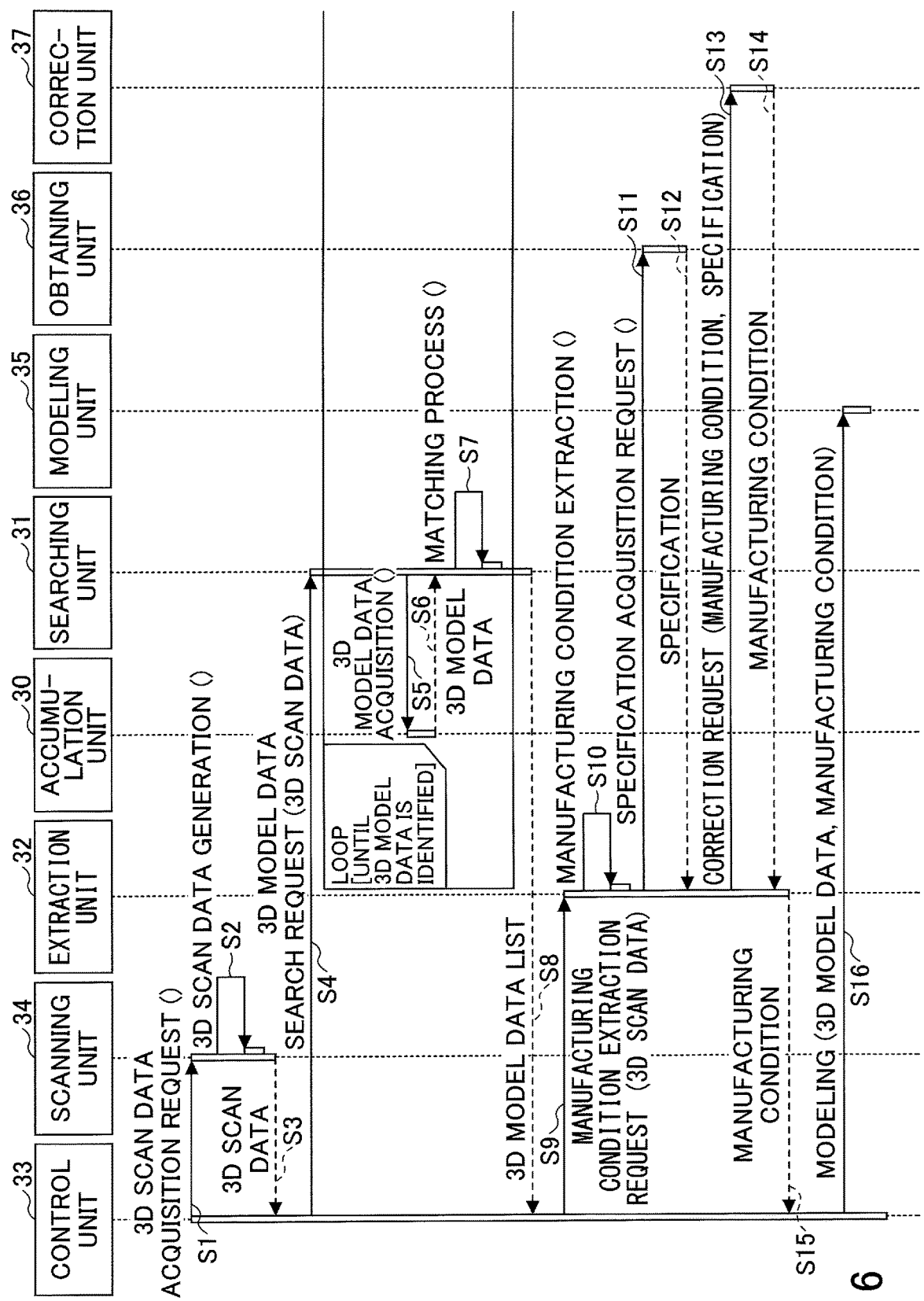
FIG. 16 is a sequence diagram illustrating a second processing flow executed by the modeling process system.

Referring to FIG. 16, processes performed by the modeling system including the above functional structure will be described in detail. Processes from S1 to S10 in FIG. 16 have already been described while making reference to FIG. 8, and the descriptions will be omitted. The extraction unit 32 requests that the obtaining unit 36 obtain the specifications of the modeling unit 35 (S11). The obtaining unit 36 obtains the specifications as described above, and transmits the specifications to the extraction unit 32 (S12).

The extraction unit 32 transmits the extracted modeling condition and the received specifications to the correction unit 37 (S13). The correction unit 37 corrects the received modeling condition based on the received specifications, and transmits the corrected modeling condition to the extraction unit 32 (S14). The extraction unit 32 transmits the received corrected modeling condition to the control unit 33 (S15).

The control unit 33 transmits the identified 3D model data and the corrected modeling condition obtained from the extraction unit 32 to the modeling unit 35, and requests that the modeling unit 35 perform modeling (S16). In response to receiving the request, the modeling unit 35 models a modeling object based on the 3D model data and the corrected modeling condition.

Figure 17:
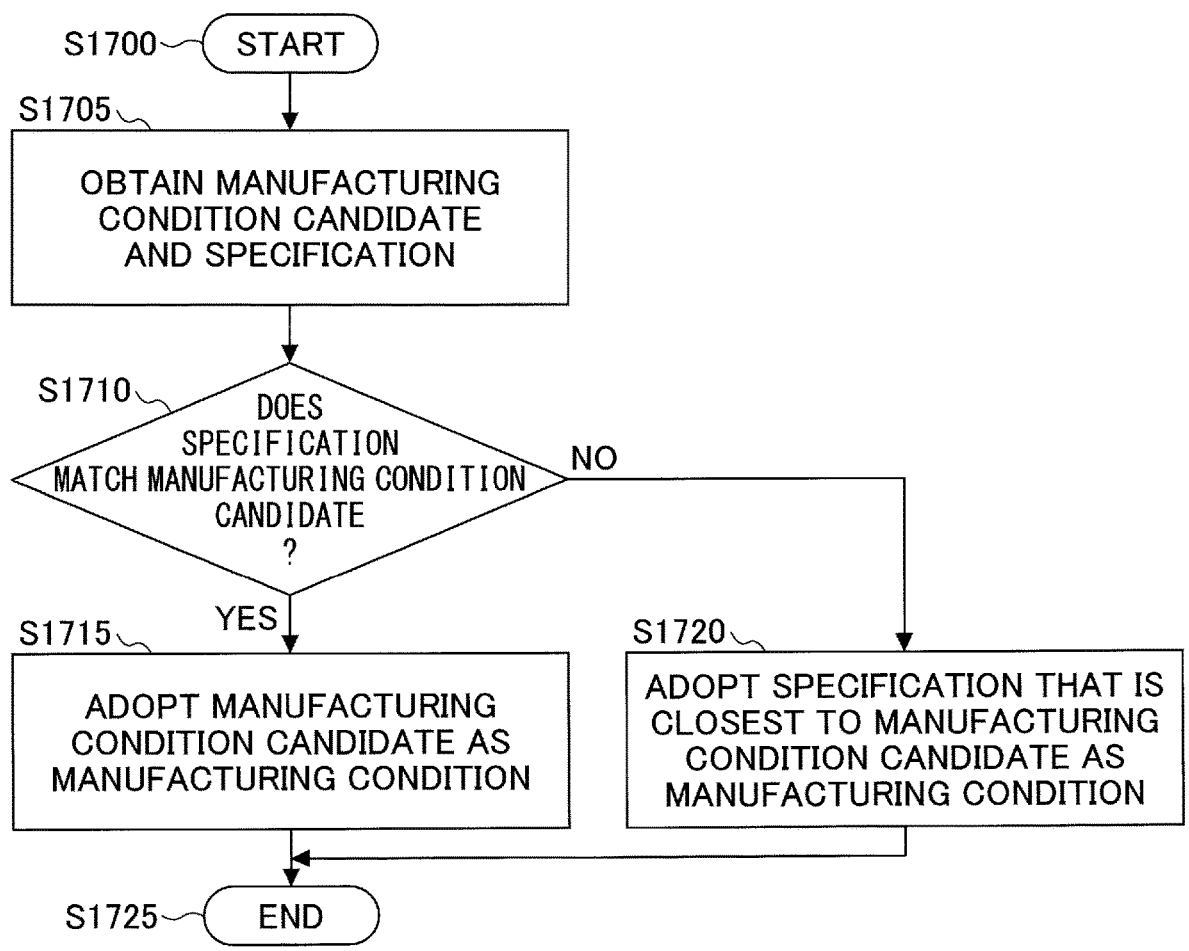
FIG. 17 is a flowchart illustrating a process flow for correcting a modeling condition.

Here, the correction performed by the correction unit 37 will be described in detail while making reference to FIG. 17. When the correction unit 37 receives the request from the extraction unit 32, the process starts from S1700. In S1705, the modeling condition and the specifications of the modeling unit 35 are obtained. In S1710, the correction unit 37 determines whether there are specifications that match the modeling condition in the specifications. If the modeling condition includes a value 0.18 mm for the layer pitch, then, the correction unit 37 determines whether the same value is included in the specifications.

In the case where the modeling condition includes the layer pitch and the modeling direction, the correction unit 37 determines whether there are specifications that match the modeling condition by determining whether respective values for the layer pitch and the modeling direction are included in the specifications. Therefore, in the case where the respective values are included, it is determined that there are specifications that match the modeling condition, and the process proceeds to S1715, and in the case where neither of the values are included, or one of the values is not included, it is determined that there are no specifications that match the modeling condition, the process proceeds to S1720.

In S1715, the modeling condition obtained from the extraction unit 32 is adopted as the modeling condition to be transmitted to the modeling unit 35, and the process ends in S1725. In S1720, what are closest to the modeling condition obtained from the extraction unit 32 in the specifications is adopted as the modeling condition, and the process ends in S1725.

In the case where neither of the layer pitch and the modeling direction match the specifications, the values for the layer pitch and the modeling direction are corrected to what are closest to the obtained modeling condition in the specifications, and, in the case where one of the layer pitch and the modeling direction does not match the specifications, the one of the layer pitch and the modeling direction is corrected to what is closest in the specifications and the other of the layer pitch and the modeling direction is not corrected. In other words, with respect to the other of the layer pitch and the modeling direction, the correction unit 37 adopts what is obtained from the extraction unit 32 as the modeling condition without correction.

According to the above operations, it is possible for the modeling unit 35 to perform the modeling reliably, and, even if the 3D scan data is not accurate and, as a result, the extracted modeling condition is not accurate, it is still possible to perform the modeling under the appropriate modeling condition.

In the above descriptions, the searching unit 31 performs the matching process for all of the 3D model data sets accumulated in the accumulation unit 30, and identifies the 3D model data set. According to the above, it takes too much time for identifying the 3D model data performed by the searching unit 31. Therefore, the modeling system may have a functional structure illustrated in FIG. 18 in order to limit the target for performing the matching process and to reduce the time required for a process for identifying the 3D model data.

Figure 18:
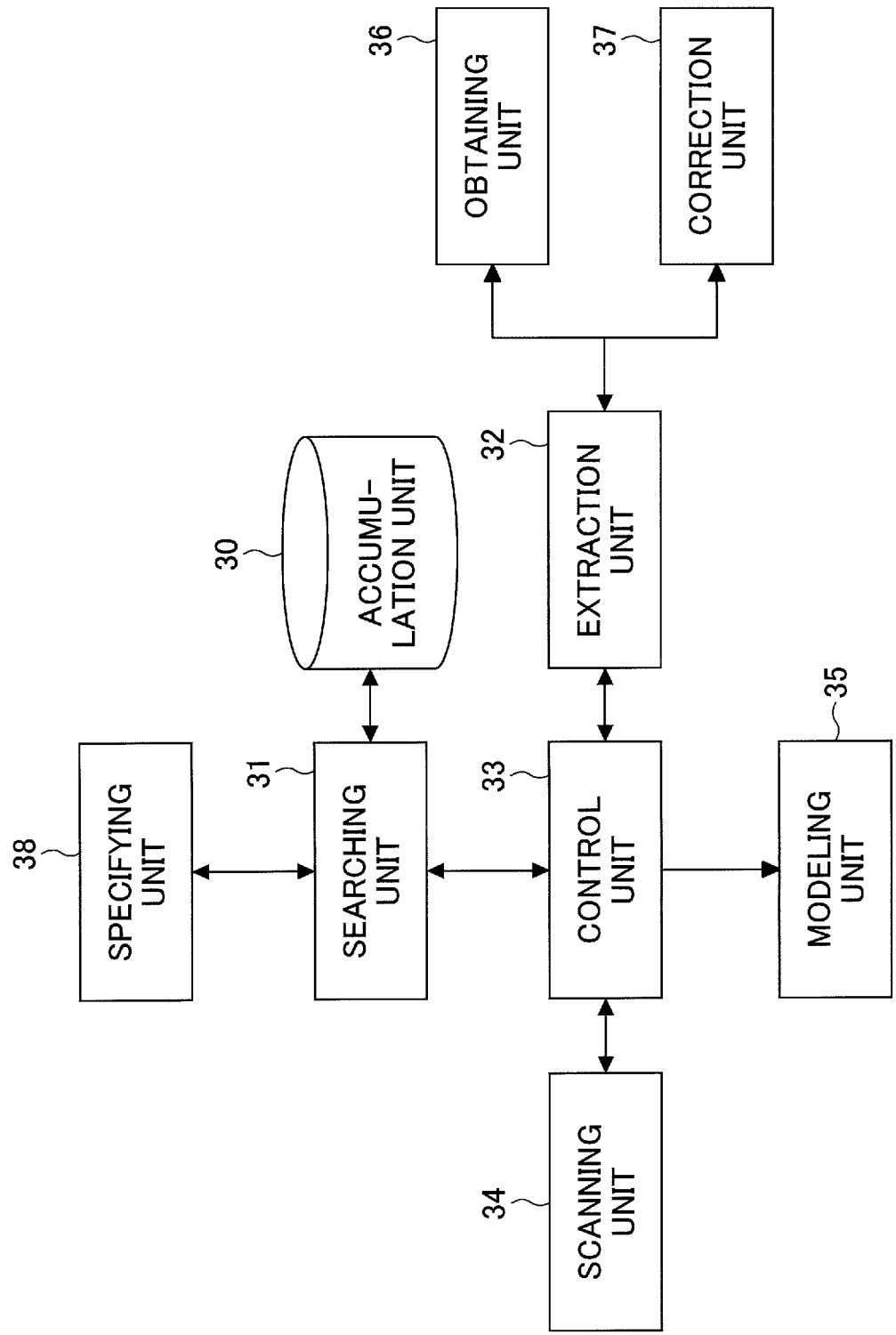
FIG. 18 is a block diagram illustrating a third functional structure of the modeling process system.

FIG. 18 is a block diagram illustrating a third functional structure of the modeling system. The modeling process system includes, similar to the functional structure illustrated in FIG. 15, an accumulation unit 30, a searching unit 31, an extraction unit 32, a control unit 33, a scanning unit 34, and a modeling unit 35, an obtaining unit 36 and a correction unit 38, and in addition, includes a specifying unit 38. As the accumulation unit 30, the searching unit 31, the extraction unit 32, the control unit 33, the scanning unit 34, the modeling unit 35, the obtaining unit 36, and the correction unit 37 have already been described above, here, only the specifying unit 38 will be described. It should be noted that the modeling system may include an accumulation unit 30, a searching unit 31, an extraction unit 32, a control unit 33, a scanning unit 34, a modeling unit 35, and a specifying unit 38.

The searching unit 31 requests that the specifying unit 38 obtain information on the search target 3D model data sets. In response to receiving the request, the specifying unit 38 transmits a list of the search target 3D model data sets as the information on the search target 3D model data sets. The 3D model data sets are associated with identification information items (IDs) for identifying the 3D model data sets, and the specifying unit 38 transmits to the searching unit 31 a list including one or more IDs. It should be noted that the list is not limited to a list of IDs. As long as the data sets are identified, the list may be a list of data names, or the like, that are given to the data sets.

It is possible for the specifying unit 38 to specify the search target 3D model data according to a predetermined specifying condition. The specifying condition may be specified by a user from a UI (User Interface), or may be specified by a condition that 3D model data sets after a certain period of elapsed time are excluded from the target. The above condition is just an example, and the specifying condition is not limited to the above.

Figure 19:
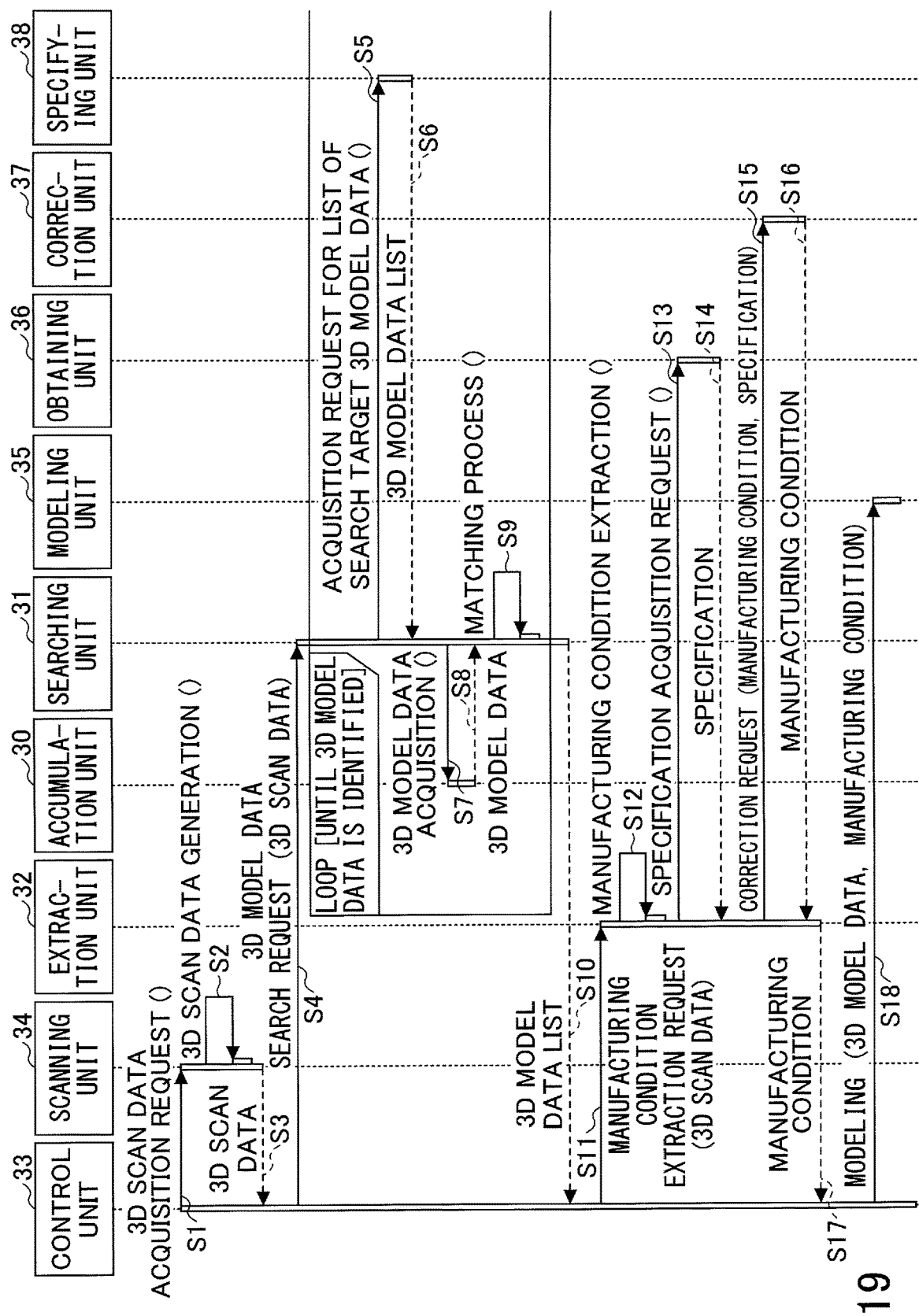
FIG. 19 is a sequence diagram illustrating a third processing flow executed by the modeling process system.

Referring to FIG. 19, processes performed by the modeling system including the above functional structure will be described in detail. Processes from S1 to S4 and processes from S9 to S18 in FIG. 19 have already been described while making reference to FIG. 8 and FIG. 16, and the descriptions will be omitted.

The searching unit 31 requests that the specifying unit 38 obtain a list of search target 3D model data sets (S5). In response to receiving the request, the specifying unit 38 transmits a list including IDs of one or more 3D model data sets (S6). Referring to the list, the searching unit 31 requests that the accumulation unit 30 obtain 3D model data sets included in the list (S7). Further, the searching unit 31 obtains the 3D model data sets from the accumulation unit 30 (S8).

In this way, by limiting the search target, it is possible to reduce the time required for identifying the 3D model data.

The present invention has been described according to one or more embodiments as a modeling process system, a modeling process device, and a program (medium). The present invention is not limited to the above embodiments. Therefore, other additions, modifications, and deletions of the embodiments may be possible within the scope of actions and effects of the present invention. According to an embodiment of the present invention, it is possible to provide a medium that stores a program for executing a modeling process method performed by a modeling process system or a modeling process device, or provide a server device that provides the program via a network.

The present application is based on and claims the benefit of priority of Japanese Priority Application No. 2016-005209 filed on Jan. 14, 2016, the entire contents of which are hereby incorporated herein by reference.

What is claimed is:

1. A modeling process device for performing a three-dimensional object modeling process, the modeling process device comprising:
   a memory; and
   a processor coupled to the memory, wherein
   the processor accumulates a plurality of three-dimensional object information sets each including corresponding surface shape information items for three-dimensional objects in the memory,
   based on surface shape information of a three-dimensional object generated by the processor that scans a surface of the three-dimensional object, searches for a three-dimensional object information set used for modeling in the plurality of the three-dimensional object information sets accumulated in the memory, and
   extracts a modeling condition that has been used for modeling the three-dimensional object according to the generated surface shape information that has been generated by the processor, the modeling condition including at least one or more of a layer pitch and a layering direction that have been specified for modeling the three-dimensional object, and wherein
   the processor transmits to a 3D printer the three-dimensional object information set that has been searched for by the processor and the extracted modeling condition that has been extracted by the processor to cause the 3D printer to model a modeling object as a copy of the three-dimensional object, the modeling condition including at least one or more of a layer pitch and a layering direction that have been specified for modeling the three-dimensional object.

2. The modeling process device according to claim 1, wherein the processor further scans the surface of the three-dimensional object and generates the surface shape information of the three-dimensional object.

3. The modeling process device according to claim 1, wherein the processor extracts the modeling condition by using the three-dimensional object information set that has been searched for by the processor in addition to the surface shape information generated by the processor.

4. The modeling process device according to claim 1, wherein the processor further
   obtains information on modeling conditions supported by the modeling unit, and corrects the extracted modeling condition that has been extracted by the processor by using the information on the modeling conditions obtained by the processor.

5. The modeling process device according to claim 1, wherein the processor further specifies search target three-dimensional object information sets of the plurality of the three-dimensional object information sets accumulated in the memory.

6. A modeling process system for performing a modeling process of a three-dimensional object, the modeling process system comprising:
a memory, and
a processor coupled to the memory, wherein
the processor scans a surface of the three-dimensional object and generate surface shape information of the three-dimensional object,
accumulates a plurality of three-dimensional object information sets each including corresponding surface shape information items for three-dimensional objects,
searches for a three-dimensional object information set used for modeling in the plurality of the three-dimensional object information sets based on the surface shape information of the three-dimensional object generated by the processor,
extracts a modeling condition that has been used for modeling the three-dimensional object according to the surface shape information generated by the processor, the modeling condition including at least one or more of a layer pitch and a layering direction that have been specified for modeling the three-dimensional object, and
outputs the three-dimensional object information set that has been searched for and the extracted modeling condition to a 3D printer to cause the 3D printer to model a modeling object as a copy of the three-dimensional object, the modeling condition including at least one or more of a layer pitch and a layering direction that have been specified for modeling the three-dimensional object.

7. A non-transitory computer readable recording medium storing a program used for causing a computer to perform a method of obtaining and outputting information used for modeling a modeling object as a copy of a three-dimensional object, the method comprising:
scanning a surface of the three-dimensional object and generating surface shape information of the three-dimensional object;
based on the generated surface shape information of the three-dimensional object, searching for a three-dimensional object information set used for modeling in a plurality of three-dimensional object information sets that have been accumulated in a memory that accumulates the plurality of the three-dimensional object information sets each including corresponding surface shape information items for three-dimensional objects;
extracting a modeling condition that has been used for modeling the three-dimensional object according to the generated surface shape information, the modeling condition including at least one or more of a layer pitch and a layering direction that have been specified for modeling the three-dimensional object; and
outputting the three-dimensional object information set that has been searched for and the extracted modeling condition to a 3D printer to cause the 3D printer to model the modeling object, the modeling condition including at least one or more of a layer pitch and a layering direction that have been specified for modeling the three-dimensional object.

* * * * *